United States Patent [19]

Adam

[11] 4,189,714
[45] Feb. 19, 1980

[54] ANALOG-TO-DIGITAL CIRCUIT WITH ADJUSTABLE SENSITIVITY

[75] Inventor: Kenneth C. Adam, Thousand Oaks, Calif.

[73] Assignee: RCA Corporation, New York, N.Y.

[21] Appl. No.: 919,038

[22] Filed: Jun. 26, 1978

[51] Int. Cl.² .................................. H03K 13/175
[52] U.S. Cl. .................... 340/347 AD; 343/5 SM
[58] Field of Search ............ 340/347 AD; 343/5 SM; 328/116

[56] References Cited

U.S. PATENT DOCUMENTS

| | | | |
|---|---|---|---|
| 3,411,153 | 11/1968 | Steele | 340/347 AD |
| 3,555,305 | 1/1971 | Luczkowski | 328/116 |
| 3,710,264 | 1/1973 | Doty | 328/116 |
| 4,023,168 | 5/1977 | Bruder | 343/5 SM |

FOREIGN PATENT DOCUMENTS 2549626  5/1976  Fed. Rep. of Germany ... 340/347 AD

*Primary Examiner*—Charles D. Miller
*Attorney, Agent, or Firm*—Samuel Cohen; Joseph D. Lazar; Raymond E. Smiley

[57] ABSTRACT

An analog-to-digital converter of the type using a plurality of voltage comparators, each, in response to an applied reference voltage and an analog voltage to be digitized, producing one of two logic signals depending on which of the applied voltages is the greater includes apparatus for altering the reference voltages on some but not all the comparators as a function of time in response to a control signal.

In one embodiment, each of the altered reference voltages is limited to some preselected differential relative to that applied to one of the comparators which does not have its reference voltage altered as a function of time.

In another embodiment, that one comparator has its reference voltage altered as a function of ratio of the time it produces one of the two logic signals relative to the other.

6 Claims, 3 Drawing Figures

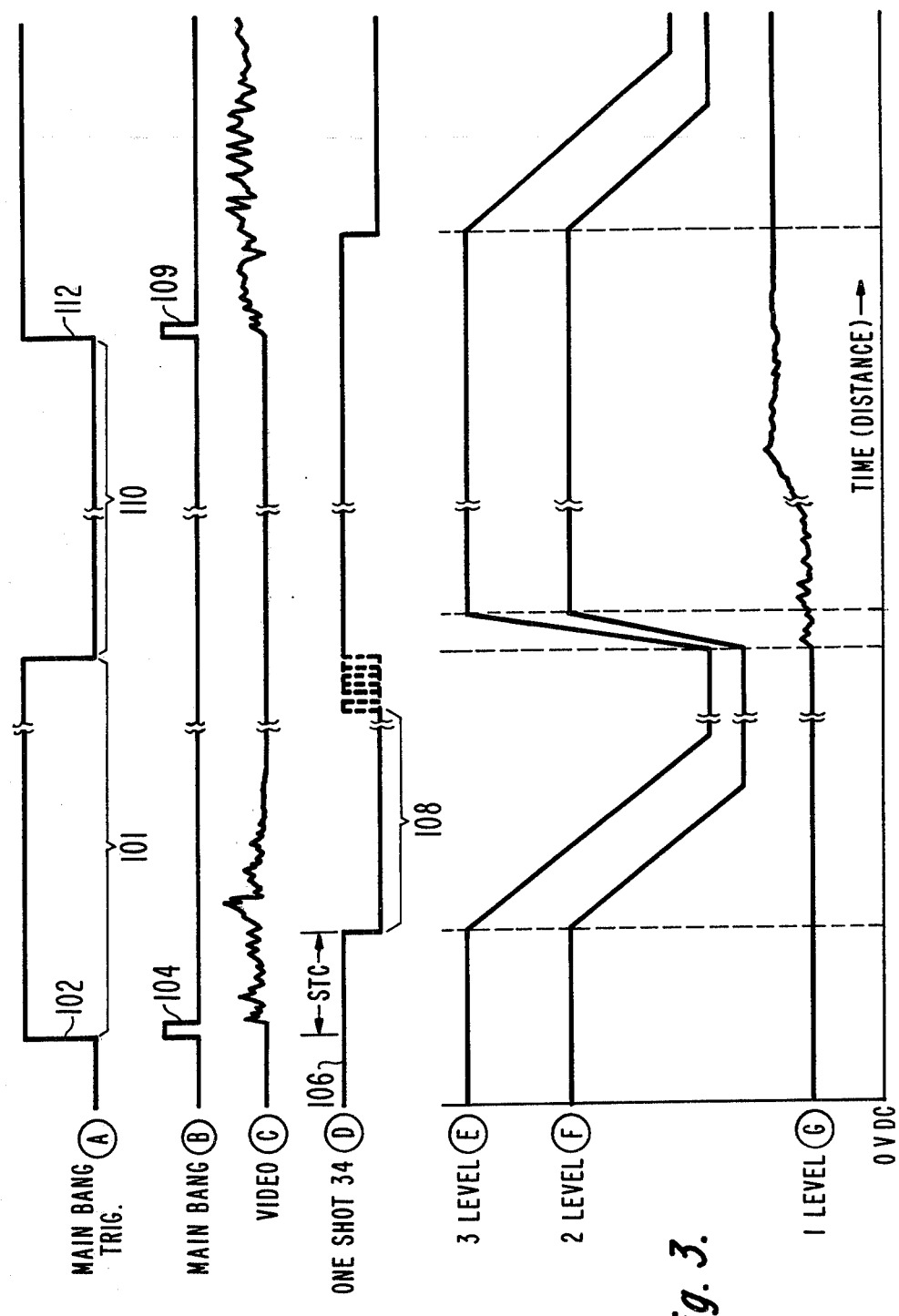

ANALOG-TO-DIGITAL CIRCUIT WITH ADJUSTABLE SENSITIVITY

BACKGROUND OF THE INVENTION

In airborne weather radar systems which emit a series of RF pulses the return signal (back scatter signal), as a function of time, is indicative of precipitation rate at increasing distances from the aircraft. The signal strength of the return signal for a given rate of precipitation is an inverse function of the distance from the aircraft. Said another way, the sensitivity decreases as a direct function of distance from the aircraft. Conventional radar systems employ circuitry which compensate for the reduction of signal strength such that a video signal produced by the compensating circuitry will be of constant value for a given rate of precipitation over a range of distances from the aircraft. The compensating network provides what is known as sensitivity time control (STC). The compensation for the distance is effective to a distance at which the assumed three nautical mile diameter target (e.g., area of precipitation) just fills the RF signal beam of the radar, known as beam filling.

For a given antenna, the distance is a given quantity. (The three nautical mile value is the assumed size of a target conventionally used by radar design engineers in their various design calculations). Beyond that distance STC is not functional and the return signal for a given rate of precipitation decreases as a function of distance from the aircraft, i.e., system sensitivity decreases.

In conventional radar systems, employing direct view storage tubes for display, the loss of sensitivity at distances beyond that at which STC is effective is not of great importance.

Modern radar systems, however, employ digital techniques and in particular typically include an analog-to-digital (A/D) converter for translating video signals produced by the compensating circuit into a four level code, the value of which, as a function of time, depends on the value of the video signal. For example, level three may represent heavy precipitation, level zero may represent no precipitation, while levels one and two represent intermediate conditions. Therefore, the video signal representative of conditions beyond that distance associated with STC (hereinafter, STC distance) will no longer give calibrated results. For example, a video signal representative of heavy precipitation which should be digitized as a level three signal, will be translated to a level two or level one giving the aircraft pilot a false indication of weather conditions beyond the STC distance. Such a radar is described in U.S. Pat. No. 4,086,579, issued Apr. 25, 1978, to F. C. Easter and assigned to the common assignee.

One solution would be to not display anything beyond the STC distance. But pilots want to "see" weather 100 to 300 nautical miles away, far beyond the STC distance which is typically on the order of thirty nautical miles. Another solution would be to increase the distance over which the compensating circuit is effective. This is, however, not always possible due to practical engineering problems.

The STC distance is limited by the antenna and receiver or system gain. Thus, the only way to extend this distance is to increase the gain. Not only is the gain limited on a technical basis, but also from a practical or cost effective basis.

SUMMARY OF THE INVENTION

In accordance with the instance invention an A/D converter utilizing a plurality of voltage comparators, each receiving a different reference voltage, includes means responsive to an external control signal for altering the reference voltage as a function of time to thereby change the sensitivity of the A/D converter. An example of such an external control signal is one produced in response to an indication that video signals being applied to the A/D are beyond the STC distance.

BRIEF DESCRIPTION OF THE DRAWING

FIGS. 3A–G are a set of waveforms useful in understanding the operation of the circuit in FIGS. 1 and 2.

DESCRIPTION OF A PREFERRED EMBODIMENT

Figure 1:
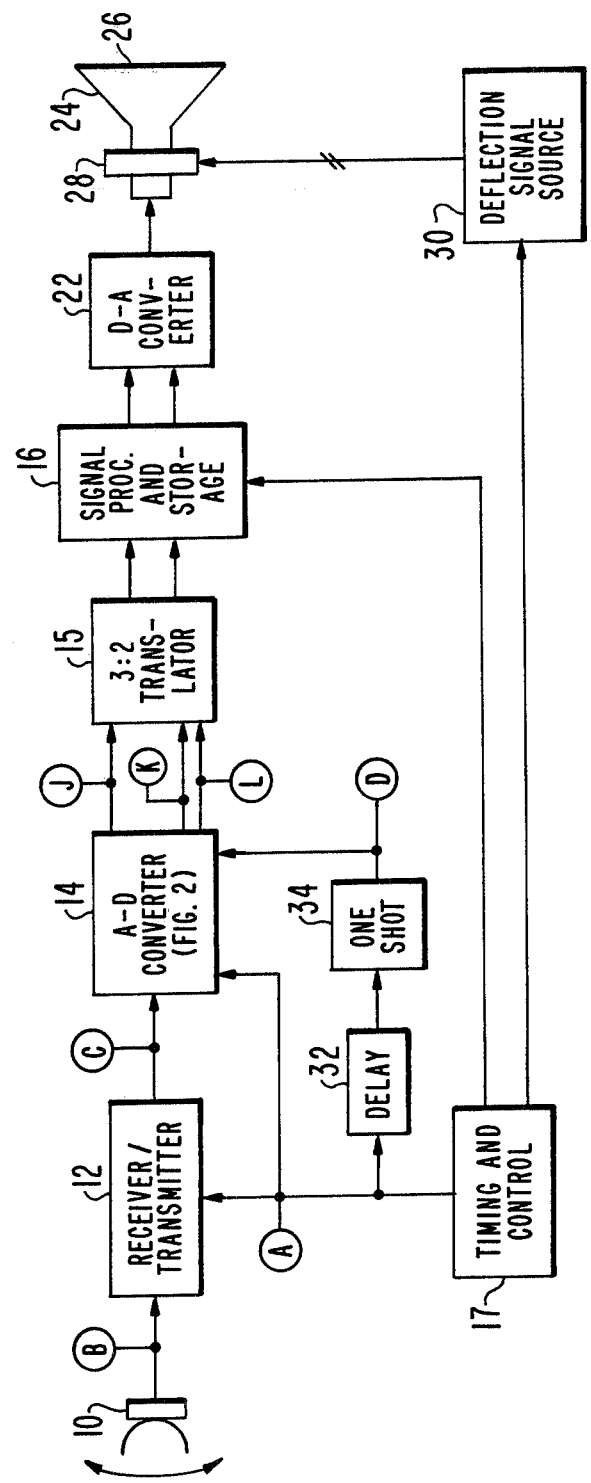
FIG. 1 is a digital weather radar in block diagram form embodying the present invention.

Referring to FIG. 1 a digital weather radar in block diagram form is illustrated which includes a transmitting and receiving antenna 10 of conventional design coupled at terminal B to the input of a conventional radar receiver-transmitter (RT) 12. The analog output signal generated by RT 12 is coupled at terminal C to an analog-to-digital converter (A/D 14) which converts the analog voltage input signals into a plurality of successive digital signals in binary form. As illustrated A/D 14 produces an output at three terminals J, K, and L, each of which is at one of two distinct voltage levels corresponding to a logic zero or a logic one. Terminal J can be at a logic 1 only if terminal K is a logic 1 while terminal K can be at a logic 1 only if terminal L is at a logic 1. A/D 14 is described in more detail in connection with the description of FIG. 2.

A/D 14 is coupled at terminals J, K, and L to a 3:2 translator 15. Translator 15 converts the signals received from A/D 14 into a two bit binary code. Translator 15 is coupled to the input terminals of a signal processing and storage device 16. Signal processing includes such things as noise reduction, target identification, and enhancement and scan conversion all as described in U.S. Pat. No. 4,023,165, issued May 10, 1977, to R. A. Holt and the instant inventor. Storage device 16 includes a memory such as a core memory, solid state memory, or if desired, a delay line for storing a plurality of digits in binary form. It also includes necessary control and timing circuits for the type of memory utilized. A general timing and control circuit (TC) 17 is also coupled to storage device 16 to control the timing of input signals thereto. The output terminals of storage device 16 are coupled to the input terminals of a digital-to-analog converter 22 of conventional design. The output terminal of digital-to-analog converter 22 is coupled to visual display device illustrated as a cathode ray tube (CRT) 24, for purposes of displaying on different parts of screen face 26 varying illumination levels or colors corresponding to signals received at antenna 10.

CRT 24 typically includes suitable electron beam deflection circuitry 28 coupled to and controlled by a source of deflection signals 30 which being known to those skilled in the art, need not be further described.

TC 17 is coupled to deflection signal source 30 for purposes of providing master timing signals thereto. TC 17 is also coupled at terminal A to receiver-transmitter RT 12 for triggering the transmission of radio frequency (RF) pulses therefrom through antenna 10 into the atmosphere. TC 17 is also coupled at terminal A to A/D 14 and via delay 32 and one shot 34 is coupled at terminal D to A/D 14. TC 17 produces at terminal A relatively positive pulses, such as 101 waveform A, FIG. 3 (hereinafter waveform 3A) the leading edge 102 of which marks start of (RF) pulses emitted from antenna 10. The amount of delay in delay 32 is equal to the time period for a radio frequency pulse to be transmitted from antenna 10 and returned thereto from a distance which is the STC distance. At a time that a signal returns from the STC distance, the positive going pulse from delay 32 triggers one shot 34 to produce a negatively directed pulse, such as 108, waveform 3D. The timing of one shot 34 is such that the negatively directed pulse produced thereby remains negative until the return signal to antenna 10 is from distances beyond those of interest which in one typical embodiment is 337 nautical miles.

Figure 2:
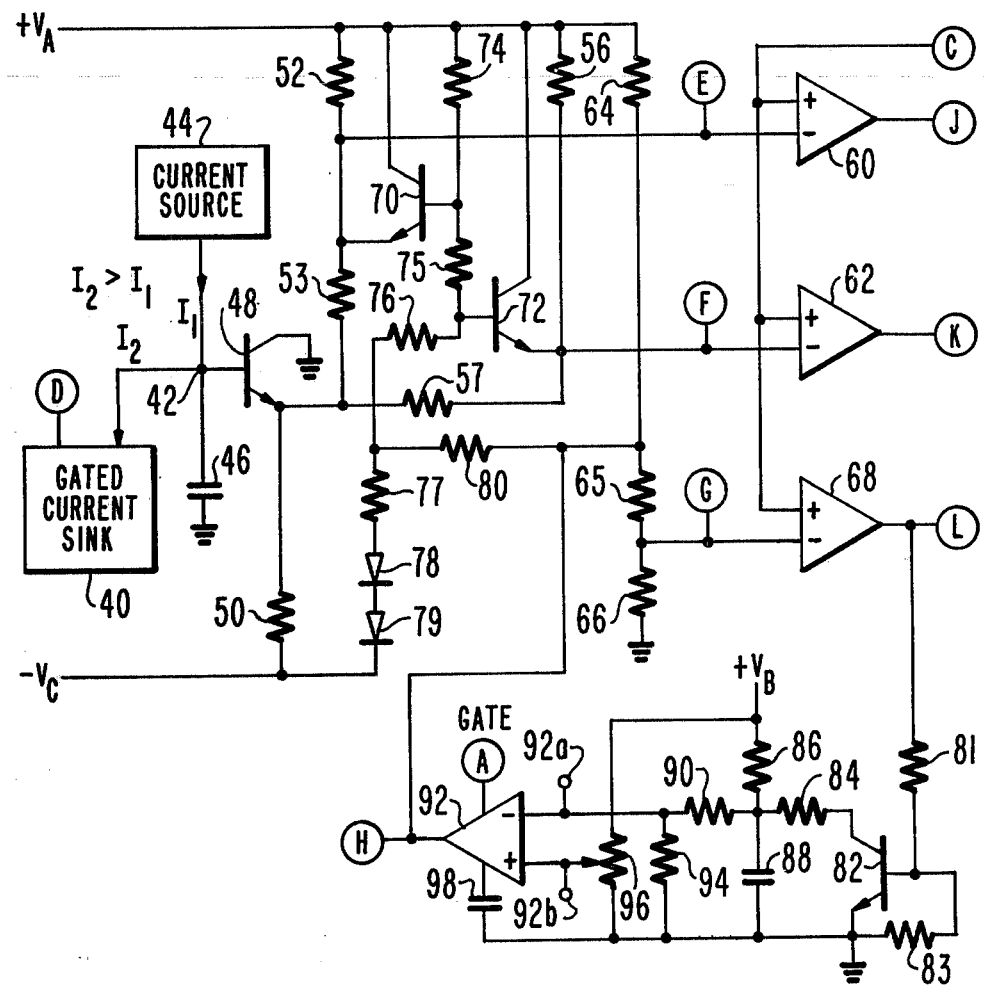
FIG. 2 is a preferred embodiment of an analog-to-digital converter in accordance with the invention as employed in the radar of FIG. 1.

A preferred embodiment of an analog-to-digital converter is illustrated in FIG. 2 to which attention is now directed. Terminal D is coupled to the control terminal of a gated current sink 40 (a source of negative current) which when switched off (signal at terminal D is relatively high) sinks (withdraws) no current and when switched on (signal at terminal D is relatively low) sinks current $I_2$ received from node 42. A current source 44 continuously supplies current $I_1$ to node 42, where $I_2$ greater than $I_1$. Also coupled to node 42 is an integrating capacitor 46 and the base of an emitter follower NPN transistor 48. The collector of transistor 48 is coupled to ground. The emitter of transistor 48 is coupled through a bias resistor 50 to a source of potential $-V_C$ and to one end of a pair of resistor divider networks 52–53 and 56–57. The other end of the pair of resistor divider networks is coupled to a second source of potential $+V_A$.

The junction of resistor divider network 52–53 is coupled at terminal E to the negative (−) terminal of a voltage comparator (VC) 60 providing a reference voltage thereto. The junction of resistor divider network 56–57 is coupled at terminal F to the negative terminal of a VC 62 providing a reference voltage thereto which due to the values of resistors 56–57 relative to resistors 52,53 is lower in value than that provided at terminal E.

A third resistor divider network comprising resistors 64, 65, and 66 is coupled between source of potential $+V_A$ and ground. The junction of resistors 65 and 66 is coupled at terminal G to the negative terminal of a third VC 68 providing a reference voltage thereto which is lesser in value than that provided at terminal F.

As will be described in detail hereinafter, the arrangement of elements 40, 44, 46, and 48 is such that, in response to an external stimulus signal applied at terminal D, the reference voltages at terminals E and F are altered as a function of time. The output terminal of RT 12 (FIG. 1) is coupled to the positive terminal of each of VC's 60, 62, and 68. So long as the minus (−) terminal of a given VC exceeds that at the positive (+) terminal the VC produces at its respective output terminal J, K, or L, a relatively low voltage termed a logic zero. When the voltage at the positive terminal at a given VC exceeds that at a negative terminal, the VC produces at its output terminal a relatively high voltage termed a logic one. The values of the resistor divider networks are such that a relatively low voltage at terminal C causes VC 68 to produce a logic one, a relatively intermediate voltage causes VC 68 and VC 62 to produce logic one signals and a relatively high voltage causes VC 60, VC 62, and VC 68 to produce a logic one voltage.

The collectors of a pair of emitter follower transistor NPN transistors 70 and 72 are coupled to reference voltage $+V_A$. The emitter of transistor 70 is coupled to terminal E while the emitter of transistor 72 is coupled to terminal F. The bases of transistors 70 and 72 are coupled to a resistor divider network comprised of series resistors 74, 75, 76, and 77 in series with temperature compensating diodes 78 and 79. One terminal of resistor 74 is connected to potential $+V_A$, while one terminal of diode 79 is connected to a third source of potential $-V_C$. The junction of resistors 76 and 77 is coupled to the junction of resistors 64 and 65 by resistor 80. Elements 70, 72, 74, 75, 76, and 77 comprise means for limiting the value to which reference voltage at terminals E and F may fall relative to the reference voltage at terminal G.

An automatic noise control circuit is coupled at the output of terminal L of VC 68 to receive signals therefrom and is coupled to terminal H to determine the reference voltage applied to VC 68 at terminal G and also determines the reference voltage applied to transistors 70 and 72.

Terminal L is resistively coupled to the base of a switching NPN transistor 82 through resistor 81. A bias resistor 83 is also coupled to the base of transistor 82. The emitter of transistor 82 is coupled to ground while the collector is coupled through series coupled resistors 84 and 86 to a source of reference potential $+V_B$. An integrating capacitor 88 is coupled between the junction of resistors 84 and 86 and ground, while resistor 90 is coupled between the same junction and the minus terminal of a gated operational transconductance amplifier (OTA) 92. A resistor 94 is coupled between the minus (−) terminal of OTA 92 and ground. Adjustable potentiometer 96 is coupled between potential $+V_B$ and ground. The adjustable tap thereof is coupled to the plus (+) terminal of OTA 92. A capacitor 98 coupled between OTA 92 and ground stores a charge depending on the difference in voltage applied to the + and − terminals of OTA 92. A negatively directed signal from TC 17 (FIG. 1) applied at terminal A actuates OTA 92 to pass signals to capacitor 98 causing charging or discharging thereof.

Operation of the system of FIG. 1 and the circuit of FIG. 2 will now be described in connection with waveforms of FIGS. 3A–3G as applicable.

It will be noted that the letters appearing on waveforms in FIG. 3 correspond to letters in terminals in FIGS. 1 and 2. Thus, waveform 3A appears at terminal A, etc. Also waveforms, 3E, F, and G all are referenced to zero volts d.c. as illustrated in FIG. 3.

In FIG. 1, antenna 10 is initially positioned to a given azimuth (by means not shown). When it is desired to radiate an RF pulse, TC 17 produces a positively directed pulse (illustrated at 102, FIG. 3) at terminal A which is applied to RT 12. RT 12 in response thereto, causes an RF pulse, known as a "main bang" pulse 104, to be radiated at terminal B from antenna 10 all in conventional manner.

The relatively positive signal at terminal A also disables OTA 92. Therefore the charge stored on capacitor 98 causes a corresponding voltage to appear at terminal H (FIG. 2) and a fraction of that voltage determined primarily by the values of resistor 65 and resistor 66 to appear at terminal G as the reference voltage for VC 68. Further, at the time of pulse 104, terminal D of gated current sink 40 is at a relatively high voltage (see waveform 3D at 106). Therefore, the gated current sink is off ($I_2=0$) and the resulting current $I_1$ applied to capacitor 46 causes a voltage at node 42 to be such that transistor 48 is turned on causing one terminal of each of resistors 53 and 57 to be substantially ground. Therefore, the values of resistors 52 and 57 and the voltage at $+V_A$ determine the reference voltage at terminal E. Similarly, the resistance of resistors 56 and 57 and the voltage at $+V_A$ determine the reference voltage at terminal F. Component values are such that the voltage at terminal E > the voltage at terminal F > the voltage at terminal G. By way of example only, it will be assumed that terminal E=4 volts, terminal F=3 volts, and terminal G=1 volt. With these assumed initial conditions, back scatter signals appearing at terminal B as a result of main bang pulse 104 are processed by RT 12 in a conventional manner and appear at terminal C as "video signals." The signal level at terminals B and C, respectively, as a function of time represent precipitation rates (if any) at increasing distances from antenna 10. As described in the "Background" section hereinabove, the signal level for a given rate of precipitation is an inverse function of the distance between antenna 10 and the precipitation. RT 12 compensates for the signal attenuation at distances up to the beam filling, STC distance, such that for all distances from zero to the STC distance a given rate of precipitation will result in a given voltage level at terminal C. Thus, with the assumed exemplary reference voltages, Table 1, summarizes conditions at terminals C, J, K, and L, for distances zero to STC distance.

TABLE I

| TERMINAL C | J | K | L |
|---|---|---|---|
| 0 to 1 volt | logic 0 | logic 0 | logic 0 |
| 1 to 3 volts | 1 | 0 | 0 |
| 3 to 4 volts | 1 | 1 | 0 |
| 4 volts and over | 1 | 1 | 1 |

In FIG. 1 3:2 transistor 15 converts logic signals appearing at terminals J, K, and L into a two level binary bit stream which is applied to and stored in processing and storage device 16 where bits are stored with regard to the azimuth of antenna 10 and the distance represented by the signals.

Independent of the rate at which storage in device 16 occurs, the stored bits are read out of device 16 at a rate determined by the desired refresh rate on display device 24. The bits are converted to an analog signal by digital-to-analog converter 22, and are displayed on screen face 26 at locations determined by deflection signal source 30.

When, following a main bang pulse such as 104, waveform 3B the signal at terminal C, FIG. 1, representing precipitation from distances greater than the STC distance will diminish for a given rate of precipitation as a direct (though not linear) function of distance.

Delay 32, FIG. 1, is set equal to the time lapse for the backscatter signal to reach antenna 10 from the STC distance following the main bang pulse with which the back scatter signal is associated. Therefore, positively directed signal portion 102 of waveform 3A which causes main bang pulse 104 to be produced is also applied to delay 32. Following the delay, one shot 34 is triggered producing the negative portion 108 of waveform 3D. One shot 34 produces the negative going signal 108 for a time at least equal to that associated with the maximum distance of interest to the radar operator and less than a time associated with a time to the next succeeding main bang pulse such as 109, FIG. 3B. When waveform 3D is low, current sink 40 is gated on with drawing current $I_2$ from node 42. As the current at node 42 decreases, so does the voltage at the base of transistor 48 and therefore the voltage at the juncture of resistors 53 and 57. These voltage drops are reflected at terminals E and F as illustrated in waveforms 3E and 3F, thus lowering the voltage supply to VC 60 and VC 62 as a function of time and therefore distance. By a proper choice of components, the shape of waveforms 3E and 3F can be made to approximate the attenuation of waveform 3C as a function of time to any desired degree of correlation. It is important that reference voltage level at terminal F does not go to and below that at terminal G. Otherwise a lower value signal will trigger VC 62, then would trigger VC 68, an unacceptable condition. Similarly, it is important that reference voltage level at terminal E does not go to and below that at terminal F for the same reason.

Transistor 70 provides the necessary clamping at terminal E, while transistor 72 provides the necessary clamping at terminal F. A voltage at the base of the transistors which determines the voltage of their emitters is determined by the voltage at terminal H with the resistance values of voltage divider resistors 74, 75, 76, and 77. With a proper choice of the resistor values, the minimum voltage at terminal E will be clamped to a value above that at terminal F which is clamped to a value greater than that at terminal E.

Thus far, circuitry has been described for setting the reference voltages at terminals E and F as a function of time and therefore distance and for clamping those voltages to values above the reference voltage applied to terminal G.

There is a time period after the generation of each main bang pulse which corresponds at distances beyond those of interest to the pilot. In FIG. 3, that time period corresponds to a relatively low amplitude portion 110 of waveform 3A. When waveform 3A is low, OTA 92 is gated on thereby coupling a value corresponding to the difference in value of the input signals at terminals 92A and 92B to capacitor 98. At all times when OTA 92 is gated on or off, switching transistor 82 is off when VC 68 is at a logic zero and on and when VC 68 is at a logic 1. When VC 68 is at a logic 0, capacitor 88 charges to a level determined by the values of resistors 86, 90, 94, and $+V_B$. When VC 68 is at a logic 1, capacitor 88 discharges to a level determined by the values of resistors 86, 90, 94, 84, and VB. When OTA 92 is gated on, which occurs when signal returns are coming from distances beyond those of interest to the operator, the video signal at terminal L is essentially noise. Thus, when VC 68 is producing a logic 1, noise above some level is present at terminal C. An acceptable noise level is factory set on potentiometer 96 with reference to the appearance of the signal on CRT screen 26 (FIG. 1). If the noise level as measured by voltage comparator 68 increases, transistor 82 is switched on causing capacitor 88 to discharge by an amount determined by the time transistor 82 is on. As capacitor 92 discharges, the voltage at the minus (−) terminal 92a of OTA 92 is decreased relative to that at terminal 92b. When the voltage at 92a is less than that at 92b, capacitor 98 discharges, thereby increasing the voltage at terminal H and at terminal G. When the voltage at terminal G increases relative to the signal amplitude at terminal C, VC 68 will produce a logic 0 causing transistor 82 to be off and thereby capacitor 88 to charge which produces a larger voltage at terminal 92a relative to terminal 92b such that capacitor 98 will reach equilibrium at some lower charge relative to that which existed prior to the assumed noise increase. This is illustrated in FIG. 3G where the amplitude on the right side of the waveform G is increased relative to that on the left side. If the noise level measured by VC 68 decreases, capacitor 88 will charge causing the voltage at the terminal 92a of OTA 92 to increase relative to that at terminal 92b. When the voltage at terminal 92a is greater than that at terminal 92b, capacitor 98 charges thereby decreasing the voltage at terminal H and at terminal G until equilibrium is again reached. In any case after the voltage at terminals H and G are fixed with regard to noise at terminal C, waveform, FIG. 3A, again goes high (waveform 3A legend 112). OTA 92 is thereby gated off causing capacitor 98 to retain the charge it acquired when OTA 92 was on. Further, a new main bang pulse 109 (waveform 3B) is produced causing the above described cycle to repeat. It will be noted that each of the clamp circuits comprising transistors 70 and 72 cause reference voltages applied to at terminals E and F to maintain the same relationship to that applied at terminal G as was true in the earlier described cycle and in addition while in the clamped condition resistor 80 causes the reference voltages at terminals E and F to respond to the noise correcting changes at terminal G.

It will be understood that the analog-to-digital converter of FIG. 2 is useful in other systems than the exemplary digital weather radar system just described. The values of the various components will, of course, be designed with reference to the particular system in which the analog-to-digital converter is utilized. However, in one exemplary working embodiment the following components are utilized.

Resistor 50 2.7 Kohms
Resistor 42 16 Kohms
Resistor 53 3.3 Kohms
Resistor 56 30 Kohms
Resistor 57 3 Kohms
Resistor 64 10 Kohms
Resistor 65 3.3 Kohms
Resistor 66 510 ohms
Resistor 74 4.3 Kohms
Resistor 75 30 ohms
Resistor 76 910 ohms
Resistor 77 3.3 Kohms
Resistor 80 9.1 Kohms
Resistor 81 10 Kohms
Resistor 83 22 Kohms
Resistor 84 2.2 Kohms
Resistor 86 22 Kohms
Resistor 90 6.8 Kohms
Resistor 94 560 ohms
Resistor 96 1 Kohms
Transistor 48 RCA CA 3096
Transistor 70 RCA CA 3045
Transistor 72 RCA CA 3045
Transistor 82 RCA CA 3045
Capacito 46 0.15 μf
Capacitor 88 0.1 μf
Capacitor 98 1 μf
Comparator 60 RCA LM361
Comparator 62 RCA LM361
Comparator 68 RCA LM361
Diode 78 1N4148
Diode 79 1N4148
$+V_A + 12VDC$
$+V_B + 5VDC$
$-V_C - 12VDC$
Operational Transconductance Amplifier 92 CA 3094

What is claimed is:

1. An analog-to-digital converter of the type including a plurality of voltage comparing means, each having a pair of terminals to which is applied, respectively, an analog voltage to be digitized and a reference voltage, for producing an output signal of a first or second value depending on whether the analog or reference voltage is the greater, said reference voltage applied to each voltage comparing means being different from that applied to the others, comprising in combination:
   means providing a control signal;
   means responsive to said control signal for altering, as a function of time, said reference voltages applied to at least one and less than all of said voltage comparing means; and
   means for clamping said altered reference voltages with respect to said reference voltages which are not altered.

2. The combination as set forth in claim 1 wherein said means for altering said at least one of said reference voltages includes means for altering, as a function of time, all except one of said reference voltages.

3. The combination as set forth in claim 1 wherein said means for altering said reference voltages comprises, for each of said voltage comparing means, voltage divider means coupled between a fixed source of potential and an alterable source of potential and coupled to said voltage comparing means to provide thereto a fraction of the voltage applied therebetween and further comprising means for altering the alterable source of potential.

4. The combination as set forth in claim 3 wherein said means for altering said alterable source of potential comprises a charge storage means, means for continuously applying a first charging current to said charged storage means, means responsive to said control signal for selectively applying a second charging current to said charge storage means which is subtractively mixed with said first charging current and means responsive to the level of charge on said charge storage means for altering said alterable voltage.

5. In a radar system for receiving and displaying weather conditions which includes antenna means for transmitting radar pulses and receiving echo return signals corresponding to each said pulse, timing means for controlling the timing of said radar pulses, receiving-transmitting means for amplifying said return signals corresponding to each said pulse to produce an analog signal which, as a function of time, represents meteorological conditions at increased distances from said antenna, analog-to-digital converter means for converting said analog signals to digital signals and display means responsive to said digital signals for displaying a pattern of weather dependent on the values of said digital signals, said analog-to-digital converter comprising in combination;
   a plurality of voltage comparing means, each having a pair of terminals to which is applied, respectively, said analog voltage to be digitized and a reference voltage, for producing an output signal of a first or second value depending on whether the analog or reference voltage is the greater, said reference voltage applied to each voltage comparing means being different from that applied to the others;

said timing means including means providing a control signal a given time after each radar pulse;

means responsive to said control signal for altering, as a function of time, said reference voltages applied to all but one of said voltage comparing means; and means for clamping the altered reference voltages with respect to said one reference voltage which is not altered.

6. The combination as set forth in claim 5 wherein the time lapse between successive radar pulses is greater than the time lapse for echo returns from a distance of interest following each radar pulse and wherein said timing means produces a timing pulse indicative of the time period when radar returns are not being received from distances of interest and further including means responsive to said timing pulse and to said output signal from said one voltage comparing means, the reference voltage of which is not altered as a function of time, being of said first value, for altering the voltage to said one voltage comparing means until said output signal is at said second value.

* * * * *